United States Patent [19]

Sugihara et al.

[11] Patent Number: 4,948,706

[45] Date of Patent: Aug. 14, 1990

[54] PROCESS FOR PRODUCING TRANSPARENT SUBSTRATE HAVING THEREON TRANSPARENT CONDUCTIVE PATTERN ELEMENTS SEPARATED BY LIGHT-SHIELDING INSULATING FILM, AND PROCESS FOR PRODUCING SURFACE-COLORED MATERIAL

[75] Inventors: Osamu Sugihara, Nagasaka; Hiroshi Masuda, Yokohama; Shogo Tsukazaki, Tokorozawa; Tameyuki Suzuki, Zushi; Junichi Yasukawa, Chigasaki; Toshiaki Ohta, Narashino; Toshio Mitsuhara, Kamagaya, all of Japan

[73] Assignees: Hoya Corporation; Shinto Chemitron Co., Ltd., both of Tokyo, Japan

[21] Appl. No.: 291,151

[22] Filed: Dec. 28, 1988

[30] Foreign Application Priority Data

Dec. 30, 1987 [JP] Japan .................. 62-334002
Dec. 30, 1987 [JP] Japan .................. 62-334005

[51] Int. Cl.$^5$ ............... G03C 5/00; G07F 1/13
[52] U.S. Cl. ................... 430/311; 430/312; 430/314; 430/316; 430/317; 430/318; 430/325; 430/313; 430/271; 430/20; 350/339 F; 350/339 R; 156/667

[58] Field of Search ............... 430/325, 271, 311, 313, 430/258, 327, 5, 20, 312, 314, 317, 318, 316; 156/667; 350/339 F, 339 R

[56] References Cited

U.S. PATENT DOCUMENTS

| | | | |
|---|---|---|---|
| 4,174,219 | 11/1979 | Andres et al. | 430/321 |
| 4,377,627 | 3/1983 | Vinton | 430/22 |
| 4,411,972 | 10/1983 | Narken et al. | 430/5 |
| 4,419,425 | 12/1983 | Ogawa et al. | 430/7 |
| 4,440,841 | 4/1984 | Tabuchi | 430/5 |
| 4,670,097 | 6/1987 | Abdalla et al. | 156/659.1 |
| 4,802,743 | 2/1989 | Takao et al. | 350/339 F |
| 4,812,387 | 3/1989 | Suzuki et al. | 350/339 F |
| 4,818,075 | 4/1989 | Takao et al. | 350/339 F |
| 4,828,967 | 5/1989 | Mase et al. | 430/315 |
| 4,873,175 | 10/1989 | Suzuki et al. | 430/311 |
| 4,877,697 | 10/1989 | Vollan et al. | 430/20 |

*Primary Examiner*—Paul R. Michl
*Assistant Examiner*—Christopher D. RoDee
*Attorney, Agent, or Firm*—Nixon & Vanderhye

[57] ABSTRACT

The present invention relates to a process for producing a transparent substrate having thereon transparent conductive pattern elements separated by a light-shielding insulating film, as well as to a process for producing a surface-colored material by utilizing said process.

15 Claims, 11 Drawing Sheets

F I G. 5(d)
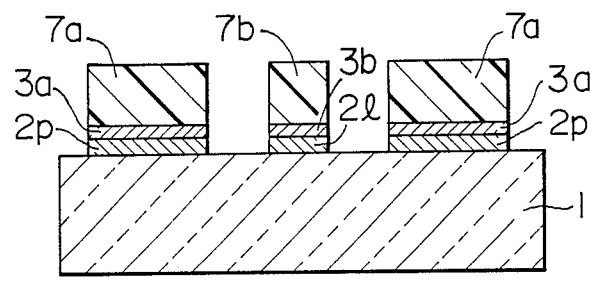
F I G. 5(e)
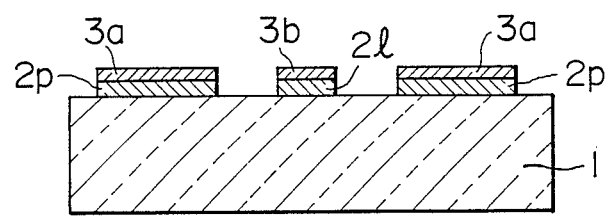
F I G. 5(f)
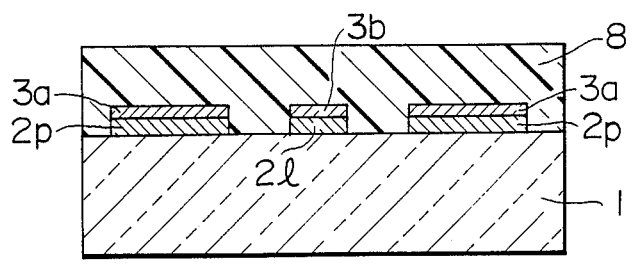

PROCESS FOR PRODUCING TRANSPARENT SUBSTRATE HAVING THEREON TRANSPARENT CONDUCTIVE PATTERN ELEMENTS SEPARATED BY LIGHT-SHIELDING INSULATING FILM, AND PROCESS FOR PRODUCING SURFACE-COLORED MATERIAL

BACKGROUND OF THE INVENTION

1. Field of the Invention

The present invention relates to a process for producing a transparent substrate having thereon transparent conductive pattern elements separated by a light-shielding insulating film, as well as to a process for producing a surface-colored material by utilizing said process.

2. Prior Art

As a conventional process for producing a surface-colored material for use in a color filter of a display device, a solid-state image sensor or the like, there is disclosed a process utilizing a polymer electrodeposition method, in Japanese Patent Application Kokai (Laid-Open) No. 115886/1984. This conventional process comprises forming a transparent conductive pattern on a transparent substrate, immersing the resulting substrate having a transparent conductive pattern thereon in a pigment-containing polymer bath for electrodeposition, and applying a voltage between the transparent conductive pattern used as an electrode and a counter electrode to form a colored layer on the transparent conductive pattern. The process has wide applications because the conditions of electrodeposition can be varied over a broad range, and moreover is simple to carry out.

In color filters where a high resolution is required, each of the blue-, green- and red-colored layer units has a very small area, which in some cases causes partial overlapping of light beams which have passed through the gap between two adjacent colored layer units or its vicinity, resulting in reduction in resolution of the color filter. The surface-colored material described in the above patent document has no means for prevention of said reduction in resolution and, when used in a color filter, is unable to avoid the reduction in resolution.

Hence, it has been carried out to form a light-shielding insulating film between the colored layer units of the surface-colored material in order to shield the unnecessary portion of the applied light. As the method for forming such a light-shielding insulating film, there are mentioned a printing method (e.g. silk screen printing, offset printing) and a photolithography method. The printing method enables only the formation of a transparent conductive pattern whose pattern-to-pattern distance is as narrow as about 100 μm at best, and cannot be applied to the formation of a light-shielding insulating film for use in color filters of high resolution.

The photolithography method is described in, for example, Japanese Patent Application Kokai (Laid-Open) No. 247331/1987. The method described in this patent document comprises forming blue-, green- and red-colored layer units on transparent conductive pattern elements on a transparent substrate according to a polymer electrodeposition method, coating a pigment-containing photocurable resin on the whole surface of the transparent substrate including the colored layer units, applying a light to only the gaps between the transparent conductive pattern elements from the back side of the transparent substrate by using the colored layer units as a light-shielding mask to cure the photocurable resin present in said gaps, removing the photocurable resin portion which has not been irradiated with the light and remains uncured, and thereby forming a light-shielding insulating film consisting of a pigment-containing cured resin, in the gaps between the transparent conductive pattern elements.

The method described in the above Japanese Patent Application Kokai (Laid-Open) No. 247331/1987, however, has the following drawbacks. In the method, the colored layer formed on a transparent conductive pattern on a transparent substrate and having a function of a color filter in the final product has another function of a light-shielding film, but the light-shielding property is ordinarily insufficient; therefore, if the back side of the transparent substrate is irradiated with an ultraviolet light at a high irradiation dose of 75 J/cm$^2$, the portion of a photocurable resin present on the colored layer causes an undesirable photocuring reaction and, if the back side of the transparent substrate is irradiated at a low irradiation dose of 50 J/cm$^2$ in order to prevent the photocuring reaction, the photocurable resin portion on the colored layer is not cured but the intended curing of the photocurable resin portion present in the gaps between the transparent conductive pattern elements becomes insufficient resulting in no formation of an intended dense, light-shielding, insulating film between the pattern elements; thus, strict control of light exposure conditions is necessary in order to form an intended dense, light-shielding insulating film between the pattern elements.

SUMMARY OF THE INVENTION

Therefore, a first object of the present invention is to provide a process for producing a transparent substrate having thereon transparent conductive pattern elements and a dense, light-shielding, insulating film of excellent accuracy in shape, dimension, etc. separating the pattern elements.

A second object of the present invention is to provide a process for producing a surface-colored material which comprises a transparent substrate, transparent conductive pattern elements having thereon dense colored layer elements of excellent accuracy in shape, dimension, etc., provided on the substrate, and a dense, light-shielding, insulating film of excellent accuracy in shape, dimension, etc., also provided on the substrate.

Other objects will be apparent from the following description and drawings.

The above first object of the present invention has been achieved by a process for producing a transparent substrate having on one side transparent conductive pattern elements separated by a light-shielding insulating film, which process comprising carrying out the following steps in the following order:

(I) a step of forming on one side of a transparent substrate transparent conductive pattern elements having thereon light-shielding inorganic film pattern elements, (II) a step of coating a pigment- and/or dye-containing curable resin on the same side of the transparent substrate, (III) a step of applying a light to the other side (the back side) of the transparent substrate to selectively cure the portion of the curable resin by using the light-shielding inorganic film pattern elements as a mask, (IV) a step of removing the uncured portion of the curable resin to form a light-shielding insulating film consisting of a colored cured resin, and (V) a step of peeling the light-shielding inorganic film pattern elements on the transparent conductive pattern elements.

The above second object of the present invention has been achieved by a process for producing a surface-colored material, which process comprising carrying out the above mentioned steps (I) to (V) in this order and then a step (VI) of forming colored layer elements on the transparent conductive pattern elements.

DETAILED DESCRIPTION OF THE INVENTION

Figure 1A:
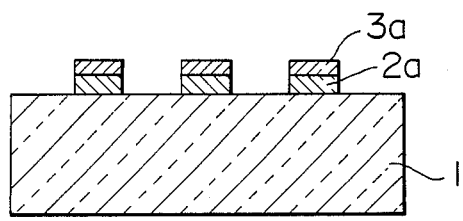
FIG. 1 shows the steps for producing a transparent substrate having thereon transparent conductive pattern elements separated by a light-shielding insulating film and then a surface-colored material.
Figure 1B:
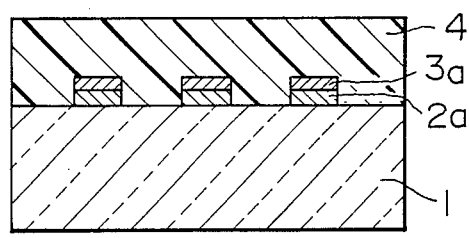
Figure 1C:
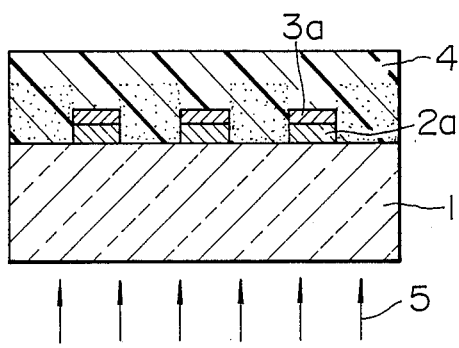
Figure 1D:
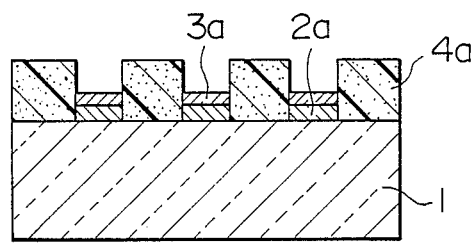
Figure 1E:
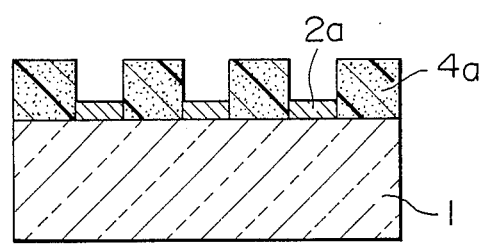
Figure 1F:
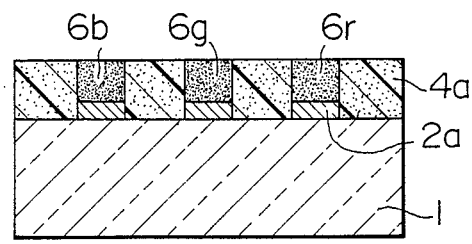
Figure 2A:
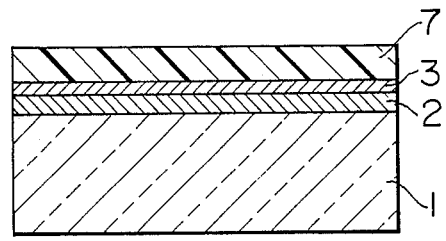
FIG. 2 shows the steps for forming on a transparent substrate transparent conductive pattern elements having thereon light-shielding inorganic film pattern elements.
Figure 2B:
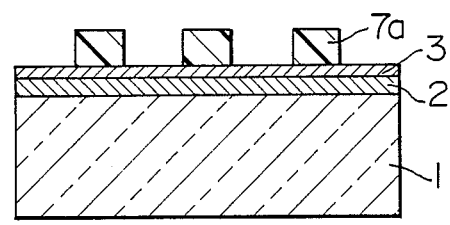
Figure 2C:
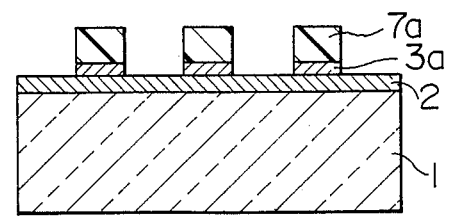
Figure 2D:
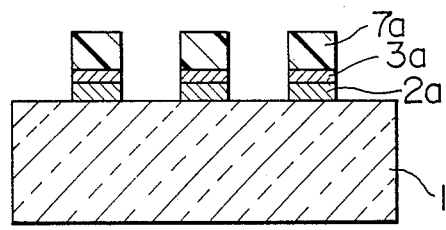
Figure 2E:
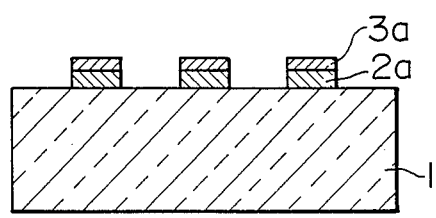
Figure 3A:
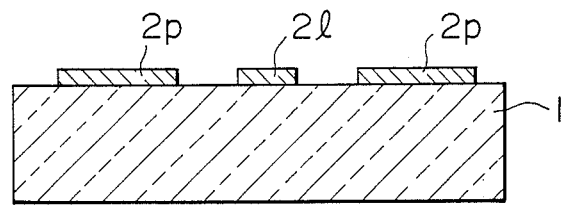
FIG. 3 shows other steps for producing a transparent substrate having thereon transparent conductive pattern elements separated by a light-shielding insulating film and then a surface-colored material.
Figure 3B:
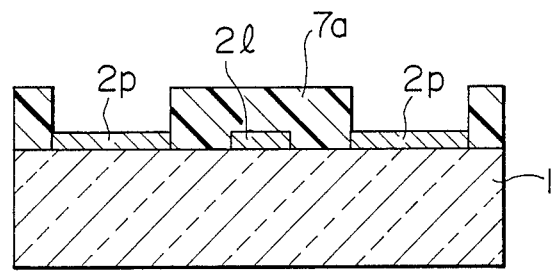
Figure 3C:
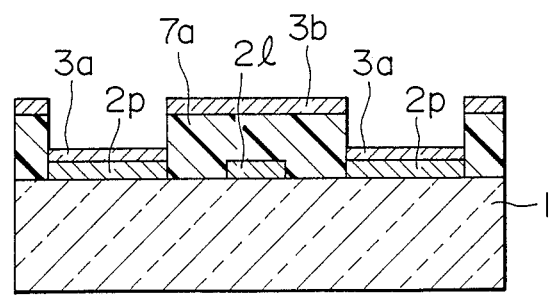
Figure 3D:
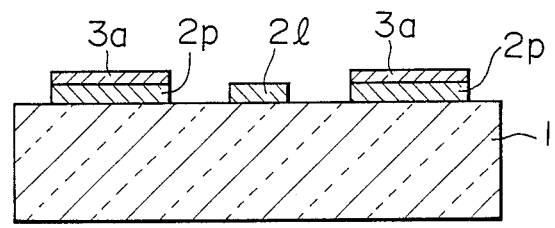
Figure 3E:
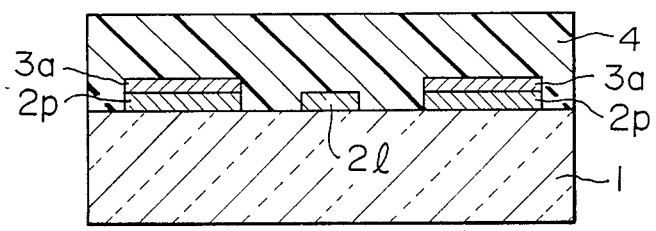
Figure 3F:
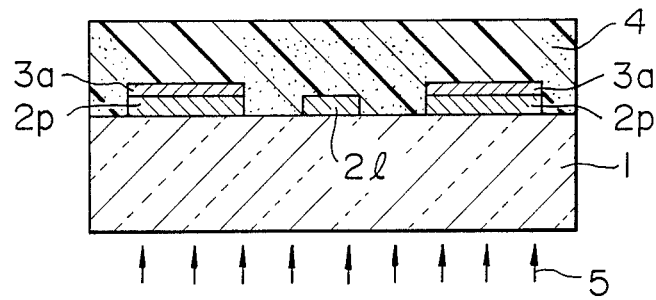
Figure 3G:
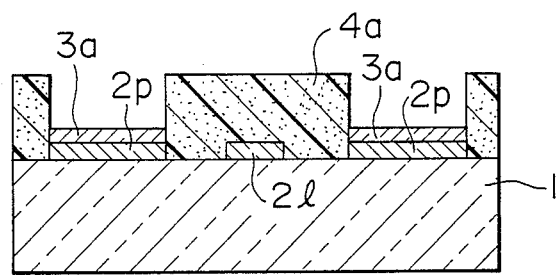
Figure 3H:
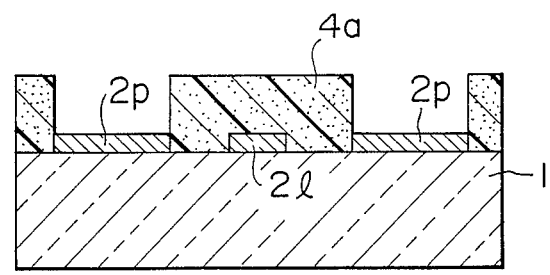
Figure 3I:
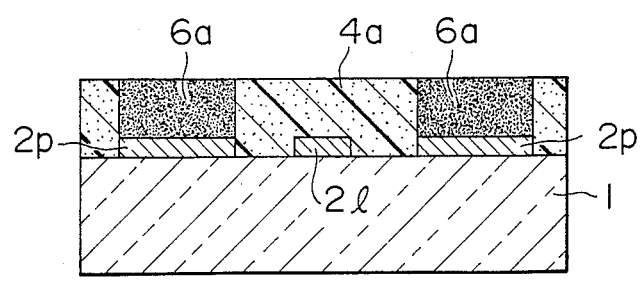

Firstly, explanation is made of the process for producing a transparent substrate having on one side transparent conductive pattern elements separated by a light-shielding insulating film, which process comprising the steps (I) to (V). The step (I) is a step of forming on one side of a transparent substrate transparent conductive pattern elements having thereon light-shielding inorganic film pattern elements.

As the transparent substrate used in the present invention, there are mentioned glass substrates such as substrates of aluminoborosilicate glass, aluminosilicate glass, borosilicate glass, soda-lime glass and silica glass, as well as plastic substrates such as substrates of acrylic resin and polycarbonate. Substrates of other materials (e.g. ceramic, sapphire) can also be used as long as they are transparent. The transparent substrate includes substrates such as glass substrates, on the surface of which is formed a transparent thin film such as a silicon dioxide film.

The formation on a transparent substrate, of transparent conductive pattern elements having thereon light-shielding inorganic film pattern elements is carried out by, for example, the following method (A) or (B).

Method (A)

This method comprises:
a step ($a_1$) of forming transparent conductive pattern elements on a transparent substrate according to a given pattern formation means (e.g. photolithography), and a step ($a_2$) of forming light-shielding inorganic film pattern elements on the transparent conductive pattern elements formed in the step ($a_1$), according to a given film formation means (e.g. electroplating, electroless plating).

Method (B)

This method comprises:
a step ($b_1$) of forming a transparent conductive film on a transparent substrate, forming on the transparent conductive film a light-shielding inorganic film which is resistant to an etching to be conducted later for the transparent conductive film, and forming a resist film on the light-shielding inorganic film, and a step ($b_2$) of subjecting the resist film formed in the step ($b_1$) to selective light exposure and development to form a resist pattern, etching the light-shielding inorganic film using the resist pattern as a mask according to an appropriate etching means to form light-shielding inorganic film pattern elements, and etching the transparent conductive film using the light-shielding inorganic film pattern elements as a mask according to an appropriate etching means to form transparent conductive pattern elements.

To begin with, there is explained the method (A) for formation on a transparent substrate, of transparent conductive pattern elements having thereon light-shielding inorganic film pattern elements.

According to the method (A), firstly in the step ($a_1$) there are formed on a transparent substrate transparent conductive pattern elements made of, for example, an ITO film (an indium tin oxide film) or a NESA film (a film of tin oxide optionally doped with antimony, etc.), according to a given pattern formation method (e.g. photolithography). This step ($a_1$) is well known to those skilled in the art and therefore no detailed explanation is made herein.

Next, the step ($a_2$) is explained. The material for the light-shielding inorganic film pattern elements formed on the transparent conductive pattern elements can be any metal as long as it has a light-shielding property. It can be, for example, nickel, silver, gold, copper, chromium, cobalt or platinum. The thickness of the light-shielding inorganic film pattern elements is sufficient if it can properly perform a function to be possessed by a light-shielding film. The thickness is, for example, 500 to 10,000 $\mu$m. The light-shielding inorganic film pattern elements can be formed by a given film formation means such as electroplating, electroless plating or the like. It is preferable that the light-shielding inorganic film pattern elements can be easily peeled in the step (V) to be described later, after having fulfilled their role. As particularly preferable light-shielding inorganic film pattern elements, there can be mentioned a nickel film formed by electroless plating. The formation of a nickel film by electroless plating is described in detail below. That is, a photoresist is coated on the whole surface of a transparent substrate having thereon transparent conductive pattern elements; only the photoresist portion on the transparent conductive pattern elements is peeled by photolithography; the exposed surfaces of the transparent conductive pattern elements are subjected to pretreatments such as activation, adhesion of catalyst, catalyst activation and the like and then to an electroless nickel plating treatment by an ordinary method; the nickel deposited on the remaining photoresist is peeled together with the photoresist; thereby, a nickel film is formed on only the transparent conductive pattern elements.

The formation of a nickel film may be conducted by a conventional electroless plating method, omitting the above mentioned photolithography method including a photoresist coating step.

The formation of the light-shielding inorganic film pattern elements may be conducted by peeling only the photoresist portion on the transparent conductive pattern elements; forming a light-shielding inorganic film such as chromium film on the whole surface of the transparent substrate by a sputtering method, a vacuum deposition method and the like; and peeling the portion of the light-shielding inorganic film on the remaining photoresist with the peeling of the photoresist.

The resulting light-shielding inorganic film pattern (e.g. nickel film formed by plating) has an excellent light-shielding property as compared with conventional colored light-shielding films containing a pigment or a dye and accordingly, in the light exposure and development (the step (III)) of a curable resin to be coated in the step (II), can hinder the transmission of a light (e.g. an ultraviolet light) and thereby can significantly prevent the curing of the curable resin present on the light-shielding inorganic film pattern.

The method (B) for formation on a transparent substrate, of transparent conductive pattern elements having thereon light-shielding inorganic film pattern elements is explained next.

According to the method (B), firstly in the step ($b_1$), a transparent conductive film consisting of, for example, an ITO film or a NESA film is formed on a transparent substrate; there is formed on the transparent conductive film a light-shielding inorganic film which is resistant to an etching means to be employed later for the transparent conductive film; then, a resist film is formed on the light-shielding inorganic film.

The light-shielding inorganic film formed on the transparent conductive film can be made of a metal (e.g. titanium, chromium, tantalum, tungsten, molybdenum), a metalloid (e.g. silicon, boron), a nonmetal (e.g. carbon), their nitride, their oxide, their carbide, their boride, their silicide or their mixture or compound. It may also be made of a ceramic. That is, the light-shielding inorganic film can have any composition as long as it is resistant to an etching to be later employed for the transparent conductive film. The expression "resistant to an etching to be employed for the transparent conductive film" implies not only that the light-shielding inorganic film is not etched by the etching for the transparent conductive film but also that the light-shielding inorganic film is less liable to be etched than the transparent conductive film. Further, the light-shielding inorganic film preferably has good adhesion to both the transparent conductive film and the resist film. The light-shielding inorganic film can be formed by, for example, a sputtering method, a CVD method, an ion plating method or a vacuum deposition method. The thus formed light-shielding inorganic film desirably has such a thickness as to uniformly cover the transparent conductive film and to sufficiently shield a light applied from the back side of the transparent substrate in the step (III) to be described later. The recommendable film thickness is, for example, 500 angstroms or more.

The light-shielding inorganic film may be a multi-layer film consisting of at least two layers, In this case, only the side of the multi-layer film adjacent to the transparent conductive film may have good adhesion to the transparent conductive film, and the side of the multi-layer film adjacent to the resist film preferably has good adhesion to the resist film.

The resist film formed on the light-shielding inorganic film can be a positive type photoresist film, a negative type photoresist film, a positive type electron beam resist film or a negative type electron beam resist film. The resist film can be formed by a spin coating method, a spray coating method, a roll coating method or the like. In the case of an electron beam resist film, an electron beam exposure method can be employed to form a resist pattern.

According to the method (B), next in the step ($b_2$), the resist film is subjected to selective light exposure and development to form a resist pattern; the light-shielding inorganic film is etched using the resist pattern as a mask according to an appropriate etching means to form light-shielding inorganic film pattern elements; and the transparent conductive film is etched using the light-shielding inorganic film pattern elements as a mask according to an appropriate etching means to form transparent conductive pattern elements.

In the step ($b_2$), the etching of the light-shielding inorganic film using the resist pattern as a mask and the etching of the transparent conductive film using the light-shielding inorganic film pattern elements as a mask are conducted by a wet etching method using an etching solution, or by a dry etching method such as a plasma etching method, a sputter etching method, a reactive ion etching method or the like.

When the etching of the light-shielding inorganic film and the etching of the transparent conductive film are conducted in two steps by the above wet or dry method, the transparent conductive film may be etched partially in the first etching step for the light-shielding inorganic film.

In the step ($b_2$), light-shielding inorganic film pattern elements are formed using the resist pattern as a mask; transparent conductive pattern elements are formed using the light-shielding inorganic film pattern elements as a mask; then, the resist pattern is peeled off. Alternatively, light-shielding inorganic film pattern elements are formed using the resist pattern as a mask; the resist pattern is peeled off; then, transparent conductive pattern elements are formed using only the light-shielding inorganic film pattern elements as a mask.

According to the method (B), in the step ($b_1$) there is provided, between a transparent conductive film and a resist film, a light-shielding inorganic film which is resistant to an etching to be later employed for the transparent conductive film; therefore, in the step ($b_2$) where the transparent conductive film is etched according to an appropriate etching means using, as a mask, the light-shielding inorganic film pattern elements formed using the resist pattern as a mask and thereby transparent conductive pattern elements are formed, the light-shielding inorganic film pattern elements (having excellent adhesion to the transparent conductive pattern elements as compared with a resist pattern consisting of an organic material) protect the portion of the transparent conductive film underlying said elements from being etched. Consequently, the side etching of the transparent conductive pattern elements is prevented and there can be obtained transparent conductive pattern elements having thereon light-shielding inorganic film pattern elements of excellent dimensional accuracy.

The transparent conductive pattern elements are aligned on the transparent substrate in such a way that each of them has a stripe shape or they consist of pixels and lead elements and the pixels form triangular patterns or mosaic patterns via the lead elements.

In the latter alignment (triangular patterns or mosaic patterns) of the transparent conductive pattern elements, colored layer elements are formed on only the pixels and a light-shielding insulating film is formed on the transparent substrate portion including the lead elements but excluding the pixels. Accordingly, in the step (I), light-shielding inorganic film pattern elements must be formed on only the pixels. This is carried out by, for example, the following method (C) or (D).

Method (C)

This method comprises:

a step ($c_1$) of forming on a transparent substrate transparent conductive pattern elements consisting of pixels and lead elements according to a given pattern formation means (e.g. photolithography), a step ($c_2$) of forming a resist film on the transparent substrate having thereon the transparent conductive pattern elements, obtained in the step ($c_1$) and then subjecting the resist film to selective light exposure and development to form a resist pattern on the substrate portion including the lead elements but excluding the pixels, and a step ($c_3$) of forming light-shielding inorganic film pattern elements on the pixels surrounded by the resist pattern formed in the step ($c_2$), according to a given film formation means (e.g. the electroplating or electroless plating used in the step ($a_2$) of the method (A)).

Method (D)

This method comprises:

a step ($d_1$) of forming a transparent conductive film on a transparent substrate, forming on the transparent conductive film a light-shielding inorganic film which is resistant to an etching to be conducted later for the transparent conductive film, and forming a resist film on the light-shielding inorganic film, a step ($d_2$) of subjecting the resist film formed in the step ($d_1$) to selective light exposure and development to form a resist pattern, etching the light-shielding inorganic film using the resist pattern as a mask according to an appropriate etching means to form light-shielding inorganic film pattern elements, and etching the transparent conductive film using the light-shielding inorganic film pattern elements as a mask according to an appropriate etching means to form transparent conductive pattern elements consisting of pixels and lead elements, and a step ($d_3$) of forming a resist film on the transparent substrate having thereon the transparent conductive pattern elements having thereon the light-shielding inorganic film pattern elements, obtained in the step ($d_2$), subjecting the resist film to selective light exposure and development to form a resist pattern on the substrate portion excluding the lead elements having thereon respective light-shielding inorganic film pattern elements, and then removing the exposed light-shielding inorganic film pattern elements on the lead elements and the resist pattern in this order.

The shapes of the light-shielding inorganic film pattern elements formed on the transparent conductive pattern elements the stripe-shaped elements and the pixels can be the same as those of the transparent conductive pattern elements, or can be smaller than the transparent conductive pattern elements. In the latter case, a light-shielding insulating film consisting of a colored cured resin is formed in the steps (II) to (V) to be described later, in such a way that the insulating film is present partially even on the transparent conductive pattern elements and, in the step (VI) to be described later, colored layer elements each smaller than each transparent conductive pattern element are formed on the transparent conductive pattern elements.

Further the light-shielding inorganic film pattern elements may be formed on the stripe pattern in such a way that a plurality of light-shielding inorganic film pattern elements each having a specific shape such as a triangle are arranged at specific intervals on each stripe pattern element. In this case, a light-shielding insulating film is formed in the steps (II) to (V) to be described later, in such a way that the insulating film is also present on the portion of the stripe pattern excluding the light-shielding inorganic film pattern elements and, in the step (VI) to be described later, colored layer elements each having a specific shape such as a rectangle are formed at specific intervals on each stripe pattern element.

The step (II) of the present process is a step of coating a pigment- and/or dye-containing curable resin on the transparent substrate.

As the curable resin used in the step (II), there is preferred a so-called ultraviolet-curable material which can be cured by a light of ultraviolet region, because of its ease in handling. Such a material can contain, as a main component, resins (e.g. acrylic resin, urethane resin, epoxy resin, synthetic rubber, polyvinyl alcohol, polyvinyl cinnamate); a combination of a reduced rubber (cis-isoprene) and allyl diazide (a crosslinking agent); and gelatin. These components can be used alone or in admixture of two or more. Various materials containing these components are commercially available as a photocurable coating or as a negative type resist. Typical examples of these commercial products include OMR-85 (a product of Tokyo Ooka). The above resins can contain, as necessary, a reactive diluent, a photoreaction initiator, a photosensitizer, etc. in order to improve the photocurability and other properties.

The curable resin used in the step (II) contains, as an essential component, a pigment and/or a dye so that the film can have a light-shielding property when made into a thin insulating cured film separating the transparent conductive pattern elements. Examples of the pigment include carbon black, iron oxide, titanium white, phthalocyanine type pigments, threne type pigments and aniline black. Examples of the dye include dyes of azo type, anthraquinone type, indigoid type, benzoquinone type, naphthoquinone type, naphthalimide type, methine type, quinoline type, nitro type, nitroso type, phthalocyanine type, carbonium type, quinoimine type, perinone type and sulfide type. The dye contained in the curable resin may be a colorless dye whch gives a colored compound when reacted with a developer. When there is used a colorless dye, it is necessary that a developer be used in combination and heat be applied at an appropriate timing after the light application of the step (III) to be described later, to produce a colored compound. The use of a colorless dye has an advantage that since the curable resin containing the dye is colorless and has a high light transmittance at the light application of the step (III), the light application can be effected at a low ultraviolet irradiation dose. As the colorless dye, there can be used, in principle, all color formers used in heat-sensitive recording materials. Examples of the colorless dye include compounds of lactone type, triphenylmethane type, fluoran type, rhodamine lactam type, fluorene type and spiropyran type. Commercial products of the colorless dye include PSD-150

(a product of Shinnisso Kako), TH-107 (a product of Hodogaya Chemical), S-205 (a product of Yamada Kagaku) and DEOC (a product of Yamada Kagaku). As the developer with which the colorless dye reacts when heated, there can be used, in principle, all developers used in heat-sensitive recording materials. Examples of the developer include bisphenol A, bisphenol S and benzyl p-hydroxybenzoate.

The coating of the pigment- and/or dye-containing curable resin on the transparent substrate is effected by printing (screen printing, offset printing), roll coating, dipping, spin coating or the like. As necessary, the pigment and/or dye-containing curable resin is mixed with a diluent such as hydrocarbon, alcohol, ester, ketone, ethyl cellosolve or the like to reduce the viscosity of the resin and to improve its coatability.

After the coating of the curable resin, the resin may be subjected to precuring in order to provide the coated resin film with a certain strength and improved adhesion to the transparent substrate and, when using a diluent, to evaporate the diluent. The precuring conditions are, for example, 50°–120° C and 10–60 minutes.

An electron beam-curable resin may be used in place of the photocurable resin.

The step (III) of the present process is a step of applying a light from the back side of the transparent substrate, i.e. the substrate side having no transparent conductive pattern elements thereon.

In the step (III), the curable resin portion on the light-shielding inorganic film pattern elements (preferably having an optical density of 1.5 or more) on the transparent conductive pattern elements receives no light and consequently remains uncured, while the other resin portion is irradiated with the light and is cured. Since the light-shielding inorganic film pattern elements have an excellent light-shielding property, the coated curable resin can be sharply divided into a cured portion and an uncured portion by the light application from the substrate backside.

The ultraviolet irradiation dose is preferably 50–100 J/cm$^2$ when a photocurable resin is used as the curable resin and a colored pigment or dye is added thereto. An ultraviolet irradiation dose higher or lower than the above range may be used in some cases. When a colorless dye and a developer are added to the above resin, the ultraviolet irradiation dose can be 10–200 mJ/cm$^2$. As mentioned above, the light-shielding inorganic film pattern elements have an excellent light-shielding property; therefore, the ultraviolet light can be applied at such a dose that the curable resin portion on the light-shielding inorganic film pattern elements remains uncured and the other curable resin portion is cured at a desired thickness; thus, it is easy to control the light application conditions.

The step (IV) of the present process is a step of removing the uncured portion of the curable resin.

The removal of the uncured portion of the curable resin is effected by the use of an agent of appropriate solvency (hereinafter referred to as "developing solution"). The developing solution is appropriately selected depending upon the type of the curable resin coated in the step (II) but is ordinarily an aqueous alkaline solution containing sodium hydroxide, sodium carbonate or the like, or an organic solvent such as an ester, ketone, alcohol, aromatic hydrocarbon, aliphatic hydrocarbon, chlorinated hydrocarbon or the like. The above removal can be effected by immersion or splashing for about 10 seconds to about 5 minutes with applying, as necessary, an ultrasonic wave. In the step (IV), the uncured portion of the curable resin is removed and there remains, in the cured portion, a colored cured resin at a desired thickness. This colored cured resin becomes a light-shielding insulating film. As mentioned above, the light application sharply divides the curable resin into a cured portion and an uncured portion; therefore in the step (IV), a light-shielding insulating film remains so as to clearly separate the individual transparent conductive pattern elements, and no cured resin is left on the light-shielding inorganic film pattern elements.

After the removal of the uncured resin, there is effected ordinary washing by water, an organic solvent or the like. After this washing, a post-curing treatment (referred to also as "baking") is effected ordinarily. When the curable resin contains a colorless dye and a developer, this post-curing gives rise to the reaction of the colorless dye and the developer to produce a colored compound, whereby the cured resin can have a light-shielding property. The conditions of post-curing differ by the type of resin but are ordinarily 150°–250° C and 30 minutes to 2 hours.

The step (V) of the present process is a step of peeling the light-shielding inorganic film pattern elements on the transparent conductive pattern elements.

This peeling is ordinarily effected by a wet method using a solution capable of dissolving the light-shielding inorganic film pattern elements. For the peeling of nickel film elements, there is used concentrated nitric acid or a mixture of concentrated hydrochloric acid, concentrated nitric acid and water (1 : 1 : 2 in molar ratio), and ordinarily there follows a washing treatment using an aqueous alkaline solution, water, isopropyl alcohol, flon, etc. in this order.

In the thus obtained product, there are formed, on a transparent substrate, transparent conductive pattern elements and a dense, light-shielding, insulating film of excellent accuracy in shape, dimension, etc. sharply separating the pattern elements. Accordingly, the product can be preferably used as a transparent electrode substrate with a light-shielding film.

Next, there is explained the process for producing a surface-colored material according to the present invention. It is a process comprising carrying out the above mentioned steps (I) to (V) in this order and then a step (VI) of forming colored layer elements on the transparent conductive pattern elements.

The formation of colored layer elements in the step (VI) can be effected by a printing method (e.g. offset printing, silk screen printing), a photolithography method, a polymer electrodeposition method, etc. Of these, the polymer electrodeposition method is useful because it can form colored layer elements on the transparent conductive pattern elements faithfuly and at a high accuracy. The polymer electrodeposition method is generally known as electrocoating and is a known method. There are two types of electrocoatings, namely, anionic electrocoating and cationic electrocoating, and both of them can be used.

As the material usable for the colored layer elements, there can be mentioned resins of maleic oil type, acrylic type, polyester type, polybutadiene type, polyolefin type, etc. These resins can be used singly or in admixture of two or more.

When the colored layer elements formed in the step (VI) need to function as a color filter, for example three different pigments of red, green and blue colors are used, and colored layer elements containing a red pigment, a green pigment or a blue pigment are formed in this order by a polymer electrodeposition method. As such pigments, there can be used red iron oxide, azo type red pigments, quinacridone type red pigments, perylene type red pigments, phthalocyanine type green pigments, phthalocyanine type blue pigments, etc. Instead of forming the colored layer elements with red, green and blue colors, respectively, using three different pigments, colored layer elements of monochrome may be formed. Further any color combination of two or more colors may be selected.

As mentioned above, by effecting the steps (I) to (V) in this order, a dense, light-shielding, insulating film of excellent accuracy in shape, dimension, etc. is formed; by further effecting the step (VI), colored layer elements of high density and excellent accuracy in shape, dimension, etc. are formed on the transparent conductive pattern elements; thus, an excellent surface-colored material can be produced.

Examples

The present invention is explained in more detail below by way of Examples.

Example 1

(1) In FIG. 1, there was used, as a transparent substrate 1, a surface-polished aluminoborosilicate glass substrate. On this substrate 1 were formed transparent conductive pattern elements 2a each having a thickness of 1,000 angstroms and a stripe shape and consisting of ITO, according to an ordinary photolithography method.

Then on the transparent substrate 1 was coated a photoresist (e.g. AZ 1350, a product of Hoechst) so that the transparent conductive pattern elements 2a were covered completely; baking was effected for 30 minutes at 90° C; and only the photoresist portions on the transparent conductive pattern elements 2a were peeled by an ordinary photolithography method. Thereafter, the transparent conductive pattern elements 2a were subjected to ordinary pretreatments (surface activation, adhesion of catalyst, catalyst activation, etc.), after which the pretreated conductive pattern elements 2a were subjected to ordinary electroless nickel plating. The nickel deposited on the remaining photoresist portion was peeled together with the underlying photoresist. Thus, light-shielding inorganic film pattern elements 3a consisting of nickel and having a thickness of 500 angstroms were formed on only the transparent conductive pattern elements 2a. (See FIG. 1 (a).)

(2) To 20 parts by weight of a mixed pigment consisting of 15 parts by weight of iron oxide and 5 parts by weight of a phthalocyanine type pigment were added 80 parts by weight of a photocurable acrylic resin (OMR-85 of Tokyo Ooka) as a curable resin and 5 PHR of a curing inhibitor (Irgacure 181 of Ciba-Geigy). The resulting resin mixture was coated on the substrate 1 by a screen printing method to form a pigment-containing photocurable resin film 4 having a film thickness of 4–6 μm. (See FIG. 1 (b).)

(3) The pigment-containing photocurable resin film 4 was precured for 30 minutes at 50°–120° C, after which an ultraviolet light 5 was applied from the back side of the substrate 1 (the substrate side having thereon no transparent conductive pattern elements 2a) at an irradiation dose of 50–100 J/cm² using an ultraviolet irradiation apparatus (Model ASE-20, a product of Nihon Denchi). (See FIG. 1 (c).) Since the light-shielding inorganic film pattern elements 3a were present on the transparent conductive pattern elements 2a, the portions of the photocurable resin film 4 on the elements 3a received no light and remained uncured; meanwhile, the portions of the photocurable resin film 4 in the gaps between the transparent conductive pattern elements 2a received the light, whereby cured resin film portions having a thickness of 1.6 μm were formed. (In FIG. 1 (c), the smudging portions of the resin film 4 indicate the cured resin film portions and the non-smudging portions indicate the uncured resin film portions.)

(4) The resulting substrate was immersed in a developing solution (Solvesso 100 of ESSO) of 250° C and subjected to a development treatment for 2–3 minutes while applying an ultrasonic wave of 40 MHz; the substrate was then subjected to a washing treatment under the same conditions as in the above development treatment; the substrate was thereafter post-cured (baked) for 60 minutes at 200° C to form a light-shielding insulating film 4a consisting of a black cured resin. (See FIG. 1 (d).) Incidentally, no cured resin was present on the light-shielding inorganic film pattern elements 3a on the transparent conductive pattern elements 2a.

(5) The resulting substrate was immersed in concentrated nitric acid to peel the light-shielding inorganic film pattern elements 3a and then washed with an aqueous alkaline solution, water, isopropyl alcohol and flon in this order to obtain a product comprising a substrate 1 having thereon (a) transparent conductive pattern elements 2a and (b) a light-shielding insulating film 4a consisting of a black cured resin, having a thickness of 1.6 μm and being present in the gaps between the transparent conductive pattern elements 2a. (See FIG. 1 (e).)

The light-shielding insulating film 4a had not only a light-shielding property but also excellent dimensional accuracy and a high density. Therefore, the product obtained in this Example could be used as a transparent electrode substrate with a light-shielding insulating film, of good dimensional accuracy.

Example 2

The product obtained in Example 1, comprising a transparent substrate 1 having thereon (a) transparent conductive pattern elements 2a and (b) a light-shielding insulating film 4a consisting of a black cured resin and being present in the gaps between the conductive pattern elements 2a, was subjected to a polymer electrocoating treatment to form a colored layer element 6b, 6g or 6r on each of the transparent conductive pattern elements 2a.

As the electrocoating solution, there were used the following three different solutions.

| Electrocoating Solutions | | | |
|---|---|---|---|
| | Symbols | | |
| Components | A-1 | A-2 | A-3 |
| Anionic polyester resin (product of Shinto Toryo) | 95.0 | 95.0 | 95.0 |
| Melamine resin (Nikarakku MX-40, product of Sanwa Chemical) | 18.0 | 18.0 | 18.0 |
| Butyl cellosolve | 25.0 | 25.0 | 25.0 |
| Ethyl cellosolve | 5.0 | 5.0 | 5.0 |
| n-Butanol | 18.0 | 18.0 | 18.0 |
| Triethylamine (neutralizing agent) | 2.5 | 2.5 | 2.5 |
| Deionized water | 831.5 | 831.5 | 831.5 |
| Phthalocyanine blue (SR-1500, product of Sanyo Shikiso) | 5.0 | — | — |
| Phthalocyanine green | — | 5.0 | — |

-continued

Electrocoating Solutions

| Components | Symbols | | |
|---|---|---|---|
| | A-1 | A-2 | A-3 |
| (SAX, product of Sanyo Shikiso) Azo type red pigment | — | — | 5.0 |
| (CARMINE FB, product of Sumitomo Chemical) | | | |
| Total (parts by weight) | 1,000.0 | 1,000.0 | 1,000.0 |

The formation of blue-, green- and red-colored layer elements 6b, 6g and 6r was effected in the following three steps. At first, blue-colored layer elements 6b were formed using the electrocoating solution A-1; then, green-colored layer elements 6g were formed using the electrocoating solution A-2; lastly, red-colored layer elements 6r were formed using the electrocoating solution A-3; thereby, colored layer elements 6b, 6g and 6r were formed on the transparent conductive pattern elements 2a. (See FIG. 1 (f).) In each of the above steps, the applied voltage was about 40 V and the application time was 10 seconds. After each step, the substrate was washed with pure water and then dried for 10 minutes at 80° C.

As described in Example 1, the light-shielding insulating film 4a had excellent dimensional accuracy; therefore, the colored layer elements 6b, 6g and 6r formed in the gaps in the light-shielding insulating film 4a, also had excellent dimensional accuracy. Further, the colored layer elements formed on the transparent conductive pattern elements 2a were aligned in the order of 6b (blue-colored layer element), 6g (green-colored layer element) and 6r (red-colored layer element). Therefore, the obtained substrate was effective as a thin film for use as a color filter.

Thus, the product obtained in this Example comprised a substrate having thereon (a) transparent conductive pattern elements having thereon blue-, green- and red-colored layer elements of good dimensional accuracy and (b) a black, light-shielding, insulating film of good dimensional accuracy present in the gaps between said conductive pattern elements. Therefore, the product could be preferably used as a color filter with a light-shielding insulating film.

Example 3

(1) In FIG. 2, a surface-precisely polished aluminoborosilicate glass substrate was used as a transparent substrate 1. On the surface of this transparent substrate 1 was formed a transparent conductive film 2 consisting of ITO and having a thickness of 1,000 angstroms by a vacuum deposition method using, as a vaporization source, a mixture consisting of 95% by weight of indium oxide and 5% by weight of tin oxide. Then, on the transparent conductive film 2 was formed a light-shielding inorganic film 3 consisting of chromium nitride and having a thickness of 800 angstroms in an argon-nitrogen mixed gas atmosphere ($N_2$ content=20% by volume, pressure=$3 \times 10^{-3}$ Torr) using a chromium target according to a DC magnetron sputtering method. This light-shielding inorganic film 3 consisting of chromium nitride is resistant to an etching means to be employed later for the transparent conductive film 2. Further, on the light-shielding inorganic film 3 was formed a resist film 7 having a thickness of 5,000 angstroms by spin-coating a positive type photoresist (AZ-1350, a product of Hoechst). (See FIG. 2 (a).)

Then, the resist film 7 was baked for 30 minutes in an atmosphere of 90° C.

The baked resist film 7 was subjected to selective light exposure by an ultraviolet light through a photomask having a given pattern and then to development by a developing solution of exclusive use for AZ-1350 to form resist elements 7a consisting of the unexposed portions of the resist film 7. (See FIG. 2 (b).)

Next, the light-shielding film 3 was subjected to etching for 50 seconds with an etching solution (23° C) (obtained by adding 165 g of ceric nitrate ammonium and 42 ml of 70% perchloric acid to pure water to make a total volume to 1,000 ml) using the resist pattern 7a as a mask to form light-shielding inorganic film pattern elements 3a. (See FIG. 2 (c).)

Thereafter, the transparent conductive film 2 was subjected to etching for 66 seconds with an etching solution (50° C) (a 1 : 1 mixture of an aqueous ferric chloride solution of 40 °Bé and 36 wt. % hydrochloric acid) using the light-shielding inorganic film pattern elements 3a as a mask to form transparent conductive pattern elements 2a. (See FIG. 2 (d).)

The resist elements 7a were peeled with a resist-peeling solution consisting of a 5% aqueous caustic soda solution to obtain a transparent substrate 1 having thereon transparent conductive pattern elements 2a and light-shielding inorganic film pattern elements 3a in this order. (See FIG. 2 (e).)

According to the above process, the transparent. conductive pattern elements 2a are formed using, as a mask, the light-shielding inorganic film pattern elements 3a which are resistant to the etching means for the transparent conductive pattern elements 2a; therefore, the side etching of the transparent conductive film 2 can be prevented, resulting in the formation of transparent conductive pattern elements 2a having higher dimensional accuracy.

(2) The transparent substrate 1 having thereon transparent conductive pattern elements 2a and light-shielding inorganic film pattern elements 3a in this order, obtained in the above (1) (refer to FIG. 2 (e) and FIG. 1 (a)) was treated in the same manner as in Example 1 (2)-(5) (refer to FIG. 1 (b)-(d)) to obtain a product as shown in FIG. 1 (e), comprising a substrate 1 having thereon (a) transparent conductive pattern elements 2a and (b) a light shielding insulating film 4a consisting of a black cured resin and being present in the gaps between the transparent conductive pattern elements 2a. According to the process of this Example, as mentioned above, the transparent conductive pattern elements 2a are formed using, as a mask, the light-shielding inorganic film pattern elements 3a which are resistant to the etching means for the transparent conductive pattern elements 2a; therefore, the side etching of the transparent conductive film 2 can be prevented, resulting in the formation of transparent conductive pattern elements 2a of higher dimensional accuracy than in Example 1; consequently, the light-shielding insulting film 4a consisting of a black cured resin formed in the gaps between the transparent conductive pattern elements 2a can also have high dimensional accuracy.

Example 4

The product obtained in Example 3 (refer to FIG. 1 (e)), comprising a substrate 1 having thereon (a) transparent conductive pattern elements 2a and (b) a light-shielding insulating film 4a of high dimensional accuracy consisting of a black cured resin and being present in the gaps between the transparent conductive pattern elements 2a, was subjected to the same polymer electrocoating treatment as in Example 2 to obtain a surface-colored material as shown in FIG. 1 (f), comprising a substrate 1 having thereon (a) transparent conductive pattern elements 2a each having thereon a blue-colored layer element 6b, a green-colored layer element 6g or a red-colored layer element 6r with the three kinds of the colored layer elements 6b, 6g and 6r being aligned orderly on the transparent conductive pattern elements 2a and (b) a light-shielding insulating film 4a present in the gaps between the transparent conductive pattern elements 2a.

According to the process of this Example, the colored layer elements 6b, 6g and 6r are formed in the gaps in the light-shielding insulating film 4a of high dimensional accuracy; accordingly, the colored layer elements also have high dimensional accuracy. That is, in the product obtained in this Example, the blue-, green- and red-colored layer elements 6b, 6g and 6r formed on the transparent conductive pattern elements 2a have good dimensional accuracy, and the black, light-shielding, insulating film 4a present in the gaps between the transparent conductive pattern elements 2a also has good dimensional accuracy; therefore, the product could be used very preferably as a color filter with a light-shielding insulating film.

Example 5

(1) In FIG. 3, a surface-precisely polished aluminoborosilicate glass substrate was used as a transparent substrate 1. On this substrate 1 was vacuum-deposited a transparent conductive film consisting of ITO (indium tin oxide) at a thickness of 1,700 angstroms. Thereon was spin-coated a positive type photoresist (e.g. AZ-1350, 7a product of Hoechst) at a thickness of 10,000 angstroms, and baking was effected for 30 minutes at 90° C to form a substrate having thereon a transparent conductive film and a photoresist in this order.

Next, the photoresist was subjected to selective light exposure by an ultraviolet light using a photomask having a given pattern and then to selective development using a given developing solution (e.g. a developing solution of exclusive use for AZ-1350) to form a given resist pattern. The resist pattern was post-baked for 30 minutes at 120° C to increase the adhesion to the transparent conductive film. The transparent conductive film was subjected to etching with an etching solution (50° C) consisting of a 1 : 1 mixed solution of an aqueous ferric chloride solution of 40° Be and 36 wt. % hydrochloric acid using the resist pattern as a mask to form transparent conductive pattern elements corresponding to the resist pattern. The etching time was 1 minute and 52 seconds which was two times 56 seconds, a minimum time needed for the etching of the transparent conductive film having a thickness of 1,700 angstroms).

The resist pattern was subjected to ultrasonic wave washing firstly with methyl cellosolve for 10 minutes and then with isopropyl alcohol for 10 minutes to peel it. The resulting substrate was dried using isopropyl alcohol vapor to obtain a substrate 1 having thereon pixels 2p and lead elements 2l both consisting of a transparent conductive film. (Refer to FIG. 3 (a).)

(2) On this substrate 1 was coated the same photoresist (AZ-1350 of Hoechst) as used in the above (1) at a thickness of 10,000 angstroms according to the same manner as in the above (1). The coated photoresist was baked for 30 minutes at 90° C to increase its adhesion. The photoresist was subjected to selective light exposure using a mask which allowed the light exposure of only the photoresist portion on the pixels 2p, and then to development with a given developing solution (a developing solution of exclusive use for AZ-1350) to form a resist pattern 7a in the gaps between the pixels 2p, 2p including those containing the lead elements 2l. (Refer to FIG. 3 (b).)

The resulting substrate was subjected to pretreatments including the activation of the pixels 2p using a hydrochloric acid-containing solution, the adhesion of a catalyst (composed mainly of a complex salt of Pd and Sn) to the pixels 2p by an immersion method and the activation of the catalyst for depositing a catalyst metal (Pd) from the complex salt of Pd and Sn, by using a strongly acidic solution containing a fluoride such as borofluoric acid or the like. Then, electroless nickel plating was effected by heating the resulting substrate to 80° C in a plating bath composed mainly of nickel chloride or sulfate and sodium hypochlorite (a reducing agent) to form on the pixels 2p light-shielding inorganic film pattern elements 3a consisting of nickel containing small amounts of impurities (phosphorus and others). (Refer to FIG. 3 (c).) The thickness of the film pattern elements 3a were controlled at 1,000 angstroms so that they had an optical density of 2 or more.

Next, the nickel film 3b on the resist pattern 7a was peeled together with the resist pattern 7a using methyl cellosolve to obtain a substrate 1 having thereon (a) pixels 2p having thereon light-shielding inorganic film pattern elements 3a consisting of nickel and (b) lead elements 2l. (Refer to FIG. 3 (d).) Since the resist pattern 7a had been formed on the substrate portion excluding the pixels 2p, the light-shielding inorganic film pattern elements 3a consisting of nickel were formed on only the pixels 2p and no light-shielding inorganic film pattern element 3a was formed on the other substrate portion.

(3) The whole surface of the substrate 1 was coated with a mixture of a light-shielding pigment (containing carbon black and iron oxide) and a photocurable acrylic resin (OMR-85 of Tokyo Ooka) so that the coated film had a thickness of 3 μm at the portion containing neither the pixels 2p nor the lead elements 2l, to form a pigment-containing photocurable resin film 4 having a light-shielding property. (Refer to FIG. 3 (e).) (In the above pigment-resin mixture, the weight ratio of pigment/resin is 20/80 to 40/60, preferably 35/65. In the case of 35/65, the 35 for the pigment consists of 5 (carbon black) and 30 (iron oxide), and such proportions of carbon black and iron oxide allow the coated film to have a resistance of about $10^9$ ohms and accordingly an insulating property.) The photocurable resin film 4 was baked for 10 minutes at 80°–90° C and then subjected to light exposure by an ultraviolet light 5 at an ultraviolet irradiation dose of 75 J/cm$^2$ from the back side of the transparent substrate 1 (the substrate side having neither the pixels 2p nor the lead elements 2l). (Refer to FIG. 3 (f).) In this light exposure, since the nickel film 3a on the pixels 2p functioned as a light-shielding film, the portion of the pigment-containing photocurable resin film 4 present on the nickel film 3a received no light and remained uncured, and only the portion of the photocurable resin film 4 in the gaps between the pixels 2p, 2p including those containing the lead elements 2l (the smudging portion in FIG. 3 (f)) received the ultraviolet light and cured.

Next, the uncured portion of the pigment-containing photocurable resin film 4 present on the light-shielding inorganic film pattern elements 3a consisting of nickel was dissolved and removed using the above mentioned developing solution (b 22° C) of exclusive use for photocurable acrylic resins (Solvesso of ESSO). The resulting substrate was scrub-washed with a washing solution consisting of pure water and then baked for 60 minutes at 200° C to form a light-shielding insulating film 4a consisting of a black cured resin in the gaps between the pixels 2p, 2p including those containing the lead elements 2l. (Refer to FIG.3 (g).) The pattern elements 3a on the pixels 2p were dissolved and removed using a mixed solution of concentrated hydrochloric acid, concentrated nitric acid and water (1 : 1 : 2 in molar ratio) to obtain a product comprising a transparent substrate 1 having thereon pixels 2p, lead elements 2l and a light-shielding insulating film 4a present in the gaps between the pixels 2p, 2p including those containing the lead elements 2l. (Refer to FIG. 3 (h).) In this product, the light-shielding insulating film 4a had excellent dimensional accuracy and was dense, because the use of the light-shielding nickel film pattern elements 3a had sharply divided the pigment-containing photocurable resin 4 into an uncured portion and a cured portion at the time of light exposure.

Accordingly, the product obtained in this Example could be used as a transparent electrode substrate with a light-shielding insulating film of good dimensional accuracy.

Example 6

The product obtained in Example 5, comprising a transparent substrate 1 having thereon pixels 2p, lead elements 2l and a light-shielding insulating film 4a present in the gaps between the pixels 2p, 2p including those containing the lead elements 2l was subjected to the following polymer electrocoating method to form colored layer elements 6a on the pixels 2p. (Refer to FIG. 3 (i).)

The polymer electrocoating method for formation of colored layer elements was effected as follows.

As the electrocoating solution, there were used the same three electrocoating solutions A-1, A-2 and A-3 as in Example 2.

Figure 4:
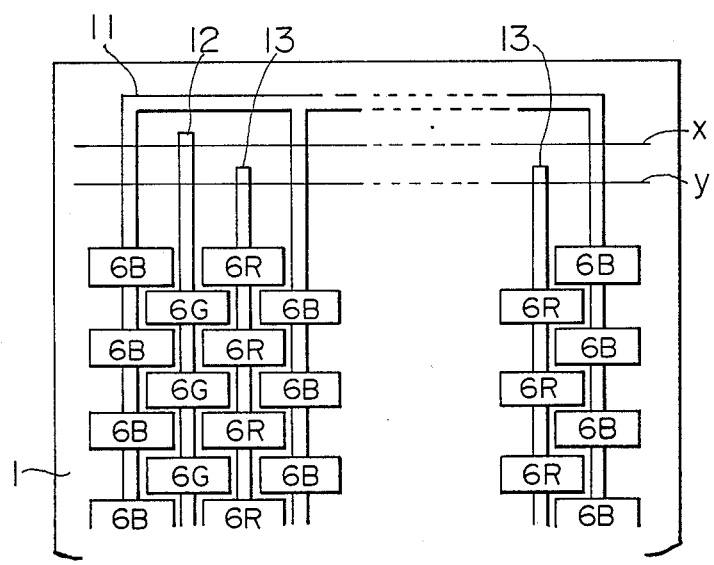
FIG. 4 is a plan view of an example of the surface-colored material obtained according to the present process.
Figure 5A:
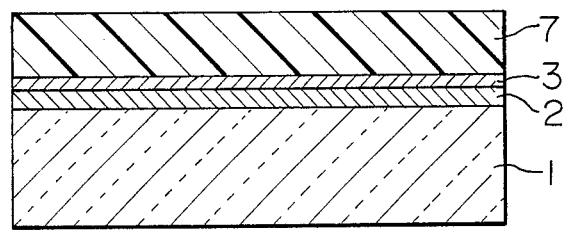
FIG. 5 shows other steps for forming on a transparent substrate transparent conductive pattern elements having thereon light-shielding inorganic film pattern elements.
Figure 5B:
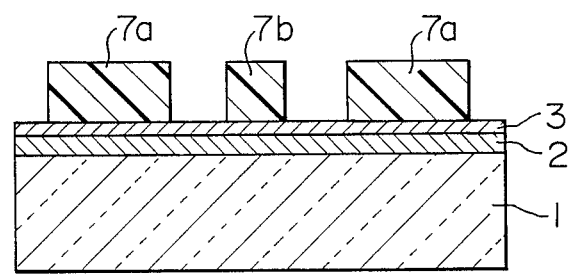
Figure 5C:
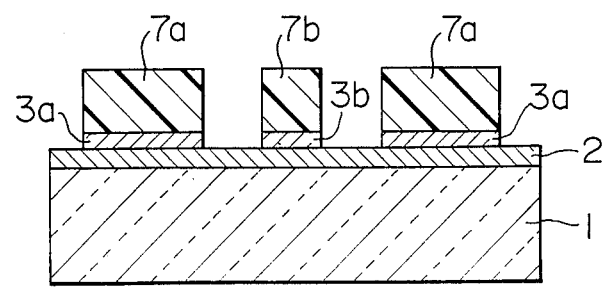
Figure 5G:
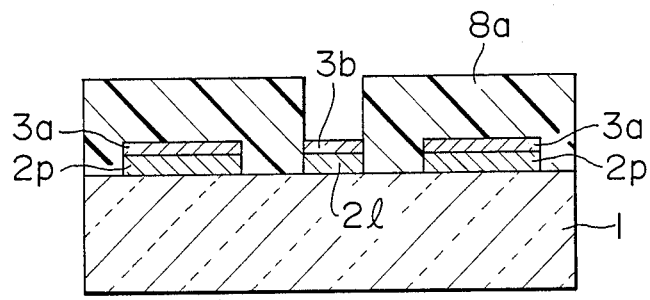
Figure 5H:
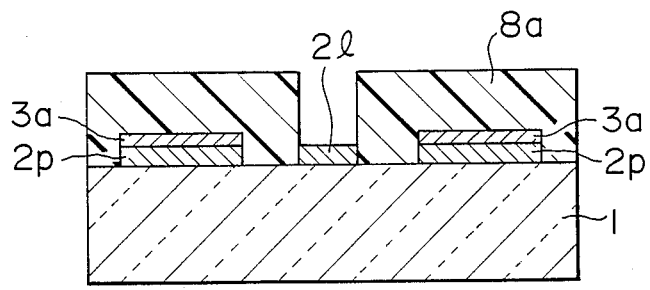
Figure 5I:
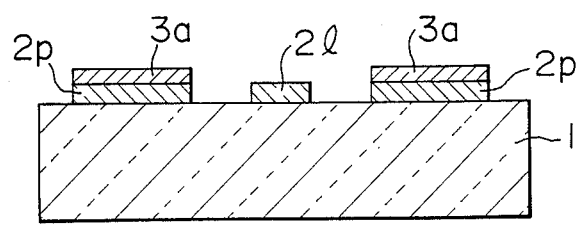

At first, blue-colored layer elements were formed as follows. That is, as shown in FIG. 4, a transparent substrate 1 having thereon transparent conductive patterns 11, 12 and 13 each consisting of pixels and lead elements, was immersed in an electrocoating bath A-1 containing phthalocyanine blue. A voltage of 40 V was applied for 10 seconds between the transparent conductive patterns 11 used as an anode and a counter electrode to form blue-colored layer elements 6B on only the pixels of the conductive patterns 11. The resulting substrate was taken out of the bath, washed with pure water and dried for 10 minutes at 80° C. No blue-colored layer elements were formed on the lead elements of the conductive patterns 11 (in FIG. 4, the conductive pattern portions other than the pixels on which the blue-colored layer elements 6B were formed), because the light-shielding insulating film 4a was present on the lead elements as shown in FIG. 3 (h).

Next, green-colored layer elements were formed as follows. That is, the transparent substrate 1 already having blue-colored layer elements on the pixels of the conductive patterns 11 was immersed in an electrocoating solution A-2 containing phthalocyanine green. A voltage was applied between the conductive patterns 12 used as an anode and a counter electrode under the same conditions as above to form green-colored layer elements 6G on only the pixels of the conductive patterns 12. The resulting substrate was washed and dried in the same manner as above. In this formation of green-colored layer elements, it was possible to pass electricity through only the conductive patterns 12 by, in FIG. 4, allowing the x portion of the substrate to contact with a conductive rubber (a silver paste may be used instead), because the conductive patterns 11 had been converted to an electric insulating layer by a high temperature drying. As in the case of the conductive patterns 11, no green colored layer elements were formed on the lead elements of the conductive patterns 12.

Lastly, red-colored layer elements were formed as follows. That is, the transparent substrate 1 already having blue-colored layer elements 6B and green-colored layer elements 6G on the pixels of the conductive patterns 11 and the pixels of the conductive patterns 12, respectively was immersed in an electrocoating solution A-3 containing an azo type red pigment. A voltage was applied between the conductive patterns 13 used as an anode and a counter electrode under the same conditions as above to form red-colored layer elements 6R on only the pixels of the conductive patterns 13. The resulting substrate was washed and dried in the same manner as above. In this formation of red-colored layer elements, it was possible to pass electricity through only the conductive patterns 13 by, in FIG. 4, allowing the y portion of the substrate to contact with a conductive rubber, because the conductive patterns 11 and 12 had been converted to an electric insulating layer by a high temperature drying. As in the cases of the conductive patterns 11 and 12, no red colored layer elements were formed on the lead elements of the conductive patterns 13.

Lastly, baking was effected for 60 minutes at 200° C to give rise to a crosslinking reaction to cure the colored layer elements, whereby there was obtained a surface-colored material as shown in FIG. 4 in which the blue-colored layer elements 6B on the pixels of the conductive patterns 11, the green-color layer elements 6G on the pixels of the conductive patterns 12 and the red-colored layer elements 6R on the pixels of the conductive patterns 13 were aligned so as to form triangular shapes.

In the above surface-colored material, the colored layer elements (6a in FIG. 3 (i) and 6B, 6G and 6R in FIG. 4) had excellent dimensional accuracy and a high density, and there was no spreading of the colored layer elements to the areas other than 6 (or 6B, 6G and 6R) because, before the formation of the colored layer elements, the light-shielding insulating film 4a consisting of a black cured resin of excellent dimensional accuracy and high density had been formed at the substrate portion other then the pixels on which the colored layer elements were formed.

Further, there was no short-circuiting by remaining nickel pieces, at the time of electrocoating because the light-shielding inorganic film pattern elements 3a consisting of nickel had been completely dissolved and removed prior to the formation of colored layer elements by electrocoating. Even if nickel pieces remain due to incomplete dissolution, there will occur no short-circuiting in electrocoating because the light-shielding insulating film already exists in the gaps between the pixels at the time of electrocoating.

Furthermore, the above surface-colored material had excellent resolution because, as mentioned above, no colored layer elements were formed on the lead elements.

Example 7

(1) In FIG. 5, a surface-precisely polished aluminoborosilicate glass substrate was used as a transparent substrate 1. On the surface of this transparent substrate 1 was formed a transparent conductive film 2 consisting of ITO and having a thickness of 1,700 angstroms by a vapor deposition method using, as a vaporization source, a mixture consisting of 95% by weight of indium oxide and 5% by weight of tin oxide. On the transparent conductive film 2 was formed a light-shielding inorganic film 3 consisting of chromium nitride and having a thickness of 800 angstroms by a DC magnetron sputtering method, in an argon-nitrogen mixed gas atmosphere ($N_2$ content=20% by volume, pressure=$3\times10^{-3}$ Torr) using a target consisting of chromium. The light-shielding inorganic film 3 consisting of chromium nitride is resistant to an etching means to be adopted later for the transparent conductive film 2. On the light-shielding inorganic film 3 was formed a resist film 7 having a thickness of 5,000 angstroms by spin-coating a positive type photoresist (AZ-1350, a product of Hoechst). (See FIG. 5 (a).) The resist film 7 was baked for 30 minutes in an atmosphere of 90° C.

The resist film 7 was subjected to selective light exposure using a photomask having a given pattern and then to selective development by a developing solution of exclusive use for AZ-1350 to form resist pattern elements 7a and 7b both consisting of the uncured portion of the resist film 7. (See FIG. 5 (b).)

Then, the light-shielding inorganic film 3 was subjected to etching with an etching solution (23° C) (obtained by adding 165 g of ceric nitrate ammonium and 42 ml of 70% perchloric acid to pure water to make a total volume to 1,000 ml) using the resist pattern elements 7a and 7b as a mask, to form light-shielding inorganic film pattern elements 3a and 3b. (See FIG. 5 (c).)

Thereafter, the transparent conductive film 2 was subjected to etching with an etching solution (50° C) obtained by mixing an aqueous ferric chloride solution of 40° Be and 36 wt. % hydrochloric acid at a 1 : 1 ratio, using the light-shielding inorganic film pattern elements 3a and 3b as a mask, to form transparent conductive pattern elements 2p and 2l. (See FIG. 5 (d).) The etching time was 112 seconds which was 2 times the just etching time (the time required for the transparent conductive film 2 having the above mentioned thickness to be etched as deep as the surface of the substrate 1).

The resist elements 7a and 7b were peeled by a resist-peeling solution consisting of a 5 wt. % aqueous caustic soda solution to obtain a transparent substrate 1 having thereon transparent conductive pattern elements 2p and 2l having thereon light-shielding inorganic film pattern elements 3a and 3b, respectively. (See FIG. 5 (e).) Incidentally, the elements 2p and the elements 2l are pixels and lead elements, respectively.

According to the above process, at the time of formation of pixels 2p and lead elements 2l, the light-shielding inorganic film pattern elements 3a and 3b which are resistant to the etching means for the transparent conductive film 2, are used as a mask; therefore, the side etching of the transparent conductive film 2 can be prevented and there can be formed pixels and lead elements both of higher dimensional accuracy.

(2) On the transparent substrate 1 having thereon transparent conductive pattern elements 2p and 2l was spin-coated a positive type photoresist (AZ-1350, a product of Hoechst) to form a photoresist film 8 having a thickness of 5,000 angstroms. (See FIG. 5 (f).) The photoresist film 8 was baked for 30 minutes in an atmosphere of 90° C. The resulting photoresist film 8 was subjected to selective ultraviolet light exposure using a photomask which applied the ultraviolet light to only the portion of the photoresist film 8 on the light-shielding inorganic film pattern elements 3b. Then, the photoresist film 8 was subjected to selective development by the same developing solution as above to form a resist pattern 8a consisting of the uncured portion of the resist film 8. (See FIG. 5 (g).) The resist pattern 8a may be formed only on the light-shielding inorganic film pattern elements 3a.

Using the above mentioned etching solution for the light-shielding film 3, the exposed light-shielding inorganic film pattern elements 3b were removed by 50 seconds of etching. See FIG. 5 (h).

Then, the resist pattern 8a was peeled with a resist-peeling solution consisting of a 5 wt. % aqueous caustic soda solution, to obtain a transparent substrate 1 having thereon (a) pixels 2p having thereon light-shielding inorganic film pattern elements 3a and (b) lead elements 2l. (See FIG. 5 (i).)

According to the above process, the resist pattern 8a of excellent dimensional accuracy can be formed on the substrate portion other than the light-shielding inorganic film pattern elements 3b on the lead elements 2l according to the photolithography method; accordingly, only the light-shielding inorganic film pattern elements 3b can be removed completely by the etching solution for the light-shielding inorganic film 3.

(3) The transparent substrate 1 obtained in the above (2), having thereon (a) pixels 2p having thereon light-shielding inorganic film pattern elements 3a and (b) lead elements 2l was subjected to the same treatment as in Example 5 (3) to obtain a product as shown in FIG. 3 (h), comprising a substrate 1 having thereon (a) pixels 2p, (b) lead elements 2l and (3) a light-shielding insulating film 4a consisting of a black cured resin and being present in the gaps between the pixels 2p, 2p including those containing the lead elements 2l.

In the above process, as mentioned above, the light-shielding inorganic film pattern elements 3a which are resistant to the etching means for the transparent conductive film 2 are used as a mask at the time of formation of pixels 2p; accordingly, the side etching of the transparent conductive film 2 can be prevented and there can be formed pixels 2p of higher dimensional accuracy than in Example 5; as a result, the light-shielding insulating film 4a consisting of a black cured resin formed in the gaps between the pixels 2p, 2p can also have high dimensional accuracy.

Example 8

The product obtained in Example 7, comprising a substrate 1 having thereon (a) pixels 2p, (b) lead elements 2l and (c) a light-shielding insulating film 4a consisting of a black cured resin and being present in the gaps between the pixels 2p, 2p including those containing the lead elements 2l was subjected to the same polymer electrocoating method as in Example 6 to obtain a surface-colored material as shown in FIG. 3 (i), comprising a transparent substrate 1 having thereon (a) pixels 2p having thereon colored layer elements 6a, (b)

lead elements 21 and (c) a light-shielding insulating film 4a consisting of a black cured resin and being present in the gaps between the pixels 2p, 2p including those containing the lead elements 2l. In this surface-colored material, as shown in FIG. 4, the blue-colored layer elements 6B on the pixels of the transparent conductive patterns 11, the green-colored layer elements 6G on the pixels of the transparent conductive patterns 12 and the red-colored layer elements 6R on the pixels of the transparent conductive patterns 13 were aligned so as to form triangular shapes.

In the above surface-colored material, the colored layer elements (6a in FIG. 3 (i) and 6B, 6G and 6R in FIG. 4) had excellent dimensional accuracy and a high density, and there was no spreading of the colored layer elements to areas other than 6a (or 6B, 6G and 6R) because, before the formation of the colored layer elements, the light-shielding insulating film 4a consisting of a black cured resin of excellent dimensional accuracy and high density had been formed at the substrate portion other than the pixels on which the colored layer elements were formed.

According to the present process for producing a transparent substrate having transparent conductive pattern elements, there can be obtained a substrate having thereon transparent conductive pattern elements and a light-shielding insulating film of high dimensional accuracy and high density, separating the transparent conductive pattern elements.

According to the present process for producing a surface-colored material, there can be obtained a surface-colored material comprising a transparent substrate having thereon (a) transparent conductive pattern elements having thereon colored layer elements of high dimensional accuracy and high density and (b) a light-shielding insulating film of high dimensional accuracy and high density.

The above-embodiments are just examples of the present invention, and therefore, it will be apparent for those skilled in the art that many modifications and variations may be made without departing from the scope of the present invention.

What is claimed is:

1. A process for producing a transparent substrate having on one side transparent conductive pattern elements separated by a light-shielding insulating film, which process comprising carrying out the following steps in the following order:
   (I) a step of forming on one side of a transparent substrate transparent conductive pattern elements having thereon light-shielding inorganic film pattern elements,
   (II) a step of coating a pigment- and/or dye-containing curable resin on the same side of the transparent substrate,
   (III) a step of applying a light to the other side (the back side) of the transparent substrate to selectively cure the portion of the curable resin by using the light-shielding inorganic film pattern elements as a mask,
   (IV) a step of removing the uncured portion of the curable resin to form a light-shielding insulating film consisting of a colored cured resin, and
   (V) a step of peeling the light-shielding inorganic film pattern elements on the transparent conductive pattern elements.

2. A process according to claim 1, wherein the step (I) of forming on one side of a transparent substrate transparent conductive pattern elements having thereon light-shielding inorganic film pattern elements is carried out by a method (A) comprising:
   a step ($a_1$) of forming transparent conductive pattern elements on a transparent substrate according to a given pattern formation means, and
   a step ($a_2$) of forming light-shielding inorganic film pattern elements on the transparent conductive pattern elements formed in the step ($a_1$), according to a given film formation means.

3. A process according to claim 1, wherein the step (I) of forming on one side of a transparent substrate transparent conductive pattern elements having thereon light-shielding inorganic film pattern elements is carried out by a method (B) comprising:
   a step ($b_1$) of forming a transparent conductive film on a transparent substrate, forming on the transparent conductive film a light-shielding inorganic film which is resistant to an etching to be conducted later for the transparent conductive film, and forming a resist film on the light-shielding inorganic film, and
   a step ($b_2$) of subjecting the resist film formed in the step ($b_1$) to selective light exposure and development to form a resist pattern, etching the light-shielding inorganic film using the resist pattern as a mask according to an appropriate etching means to form light-shielding inorganic film pattern elements, and etching the transparent conductive film using the light-shielding inorganic film pattern elements as a mask according to an appropriate etching means to form transparent conductive pattern elements.

4. A process according to claim 1, wherein the transparent conductive pattern elements consist of pixels and lead elements, said pixels forming triangular patterns or mosaic patterns and in the step (I) the light-shielding inorganic film pattern elements are formed substantially on only the pixels of the transparent conductive pattern elements.

5. A process according to claim 4, wherein the formation of the light-shielding inorganic film pattern elements on the pixels of the transparent conductive pattern elements is carried out by a method (C) comprising:
   a step ($c_1$) of forming on a transparent substrate transparent conductive pattern elements consisting of pixels and lead elements according to a given pattern formation means,
   a step ($c_2$) of forming a resist film on the transparent substrate having thereon the transparent conductive pattern elements, obtained in the step ($c_1$) and then subjecting the resist film to selective light exposure and development to form a resist pattern on the substrate portion including the lead elements but excluding the pixels, and
   a step ($c_3$) of forming light-shielding inorganic film pattern elements on the pixels surrounded by the resist pattern formed in the step ($c_2$), according to a given film formation means.

6. A process according to claim 4, wherein the formation of light-shielding inorganic film pattern elements on the pixels of the transparent conductive pattern elements is carried out by a method (D) comprising:
   a step ($d_1$) of forming a transparent conductive film on a transparent substrate, forming on the transparent conductive film a light-shielding inorganic film which is resistant to an etching to be conducted later for the transparent conductive film, and forming a resist film on the light-shielding inorganic film, a step ($d_2$) of subjecting the resist film formed in the step ($d_1$) to selective light exposure and development to form a resist pattern, etching the light-shielding inorganic film using the resist pattern as a mask according to an appropriate etching means to form light-shielding inorganic film pattern elements, and etching the transparent conductive film using the light-shielding inorganic film pattern elements as a mask according to an appropriate etching means to form transparent conductive pattern elements consisting of pixels and lead elements, and a step ($d_3$) of forming a resist film on the transparent substrate having thereon the transparent conductive pattern elements having thereon the light-shielding inorganic film pattern elements, obtained in the step ($d_2$), subjecting the resist film to selective light exposure and development to form a resist pattern on the substrate portion excluding the lead elements having thereon respective light-shielding inorganic film pattern elements, and then removing the exposed light-shielding inorganic film pattern elements on the lead elements and the resist pattern in this order.

7. A process for producing a surface-colored material comprising transparent conductive pattern elements separated by a light-shielding insulating film on a transparent substrate, as well as colored layer elements on the transparent conductive pattern elements, which process comprising carrying out the following steps in the following order:

(I) a step of forming on one side of a transparent substrate transparent conductive pattern elements having thereon light-shielding inorganic film pattern elements, (II) a step of coating a pigment- and/or dye-containing curable resin on the same side of the transparent substrate, (III) a step of applying a light to the other side (the back side) of the transparent substrate to selectively cure the portion of the curable resin by using the light-shielding inorganic film pattern elements as a mask, (IV) a step of removing the uncured portion of the curable resin to form a light-shielding insulating film consisting of a colored cured resin, (V) a step of peeling the light-shielding inorganic film pattern elements on the transparent conductive pattern elements, and (VI) a step of forming colored layer elements on the transparent conductive pattern elements.

8. A process according to claim 7, wherein the step (I) of forming on one side of a transparent substrate transparent conductive pattern elements having thereon light-shielding inorganic film pattern elements is carried out by a method (A) comprising:

a step ($a_1$) of forming transparent conductive pattern elements on a transparent substrate according to a given pattern formation means, and a step ($a_2$) of forming light-shielding inorganic film pattern elements on the transparent conductive pattern elements formed in the step ($a_1$), according to a given film formation means.

9. A process according to claim 7, wherein the step (I) of forming on one side of a transparent substrate transparent conductive pattern elements having thereon light-shielding inorganic film pattern elements is carried out by a method (B) comprising:

a step ($b_1$) of forming a transparent conductive film on a transparent substrate, forming on the transparent conductive film a light-shielding inorganic film which is resistant to an etching to be conducted later for the transparent conductive film, and forming a resist film on the light-shielding inorganic film, and a step ($b_2$) of subjecting the resist film formed in the step ($b_1$) to selective light exposure and development to form a resist pattern, etching the light-shielding inorganic film using the resist pattern as a mask according to an appropriate etching means to form light-shielding inorganic film pattern elements, and etching the transparent conductive film using the light-shielding inorganic film pattern elements as a mask according to an appropriate etching means to form transparent conductive pattern elements.

10. A process according to claim 7, wherein the transparent conductive pattern elements consist of pixels and lead elements, said pixels forming triangular patterns or mosaic patterns and in the step (I) the light-shielding inorganic film pattern elements are formed substantially on only the pixels of the transparent conductive pattern elements.

11. A process according to claim 10, wherein the formation of the light-shielding inorganic film pattern elements on the pixels of the transparent conductive pattern elements is carried out by a method (C) comprising:

a step ($c_1$) of forming on a transparent substrate transparent conductive pattern elements consisting of pixels and lead elements according to a given pattern formation means, a step ($c_2$) of forming a resist film on the transparent substrate having thereon the transparent conductive pattern elements, obtained in the step ($c_1$) and then subjecting the resist film to selective light exposure and development to form a resist pattern on the substrate including the lead elements but excluding the pixels, and a step ($c_3$) of forming light-shielding inorganic film pattern elements on the pixels surrounded by the resist pattern formed in the step ($c_2$), according to a given film formation means.

12. A process according to claim 10, wherein the formation of light-shielding inorganic film pattern elements on the pixels of the transparent conductive pattern elements is carried out by a method (D) comprising:

a step ($d_1$) of forming a transparent conductive film on a transparent substrate, forming on the transparent conductive film a light-shielding inorganic film which is resistant to an etching to be conducted later for the transparent conductive film, and forming a resist film on the light-shielding inorganic film, a step ($d_2$) of subjecting the resist film formed in the step ($d_1$) to selective light exposure and development to form a resist pattern, etching the light-shielding inorganic film using the resist pattern as a mask according to an appropriate etching means to form light-shielding inorganic film pattern elements, and etching the transparent conductive film using the light-shielding inorganic film pattern elements as a mask according to an appropriate etching means to form transparent conductive pattern elements consisting of pixels and lead elements, and a step (d₃) of forming a resist film on the transparent substrate having thereon the transparent conductive pattern elements having thereon the light-shielding inorganic film pattern elements, obtained in the step (d₂), subjecting the resist film to selective light exposure and development to form a resist pattern on the substrate portion excluding the lead elements having thereon respective light-shielding film pattern elements, and then removing the exposed light-shielding inorganic film pattern elements on the lead elements and the resist pattern in this order.

13. A process according to claim 7, wherein the step (VI) of forming colored layer elements on the transparent conductive pattern elements is carried out by a polymer electrodeposition method.

14. A process according to claim 1, wherein the transparent conductive pattern elements are aligned on the transparent substrate in such a way that each of them has a stripe shape, and in step (I) the light-shielding inorganic film pattern elements are formed on substantially all the transparent conductive pattern elements.

15. A process according to claim 7, wherein the transparent conductive pattern elements are aligned on the transparent substrate in such a way that each of them has a stripe shape, and in step (I) the light-shielding inorganic film pattern elements are formed on substantially all of the transparent conductive pattern elements.

* * * * *